United States Patent [19]
Yeh

[11] Patent Number: 5,111,189
[45] Date of Patent: May 5, 1992

[54] FAULT INDICATOR WITH TIMING CONTROL

[75] Inventor: Thomas Yeh, South Weymouth, Mass.

[73] Assignee: Sigma Instruments, Inc., Weymouth, Mass.

[21] Appl. No.: 441,461

[22] Filed: Nov. 27, 1989

[51] Int. Cl.$^5$ .................... H02H 7/00; G08B 21/00
[52] U.S. Cl. .................................... 340/664; 324/133
[58] Field of Search ..................... 340/664; 324/133

[56] References Cited

U.S. PATENT DOCUMENTS

| 2,709,800 | 5/1955 | Temple et al. | 340/664 |
| 3,493,839 | 2/1970 | De Puy | 340/664 |
| 3,641,548 | 2/1972 | Groce | 340/664 |
| 4,153,924 | 10/1987 | Moran | 361/94 |
| 4,231,372 | 11/1980 | Newton | 361/42 |
| 4,346,307 | 8/1982 | Zulaski | 361/86 |
| 4,754,162 | 6/1988 | Kondou et al. | 361/96 |
| 4,797,661 | 1/1989 | Wiley | 340/664 |
| 5,003,426 | 3/1991 | Yeh et al. | 361/59 |

FOREIGN PATENT DOCUMENTS

| 1138025 | 12/1982 | Canada | 361/42 |
| 1588278 | 2/1971 | Fed. Rep. of Germany | 324/133 |
| 0317782 | 12/1988 | Japan | 324/133 |
| 0085519 | 3/1989 | Japan | 361/96 |
| 0026223 | 1/1990 | Japan | 361/93 |
| 0047556 | 2/1990 | Japan | 324/133 |
| 0612023 | 6/1979 | Switzerland | 324/133 |
| 1207323 | 9/1970 | United Kingdom | 324/133 |

*Primary Examiner*—Steven L. Stephan
*Assistant Examiner*—Thomas M. Dougherty
*Attorney, Agent, or Firm*—Stanger, Michaelson, Spivak & Wallace

[57] ABSTRACT

In the disclosed fault indicator a sensing device is arranged for location in the magnetic field surrounding a conductor, an electronic device responsive to the sensing device assumes a first state in response to the sensing device sensing a trip condition and remains in the first state until set to a second state, a signaling device coupled to the electronic device serves for generating a signal only in response to the electronic device being in the first state, and a timing device responsive to the electronic device assumes the first state serves for setting the electronic device to the second state after a predetermined period. The sensing device is an inductive sensor, preferably a coil with an axis transverse to the conductor. In one embodiment an inrush restraint circuit renders the electronic device insensitive to inrush currents.

7 Claims, 4 Drawing Sheets

FAULT INDICATOR WITH TIMING CONTROL

This application is related to the application of T. Yeh, Ser. No. 374,215, filed Jun. 30, 1989, and assigned to the same assignee as the present invention.

BACKGROUND OF THE INVENTION

This invention relates to fault indicators, and particularly fault indicators having timing mechanisms to reset the indicators after predetermined periods.

Fault indicators, also known as faulted current indicators or FCIs, are mounted at spaced locations along conductors or cables of power distribution systems. When a conductor in a power distribution system experiences an overcurrent as a result of a fault, all the fault indicators between the fault and the power source trip to indicate a fault condition. The fault indicators beyond the fault, more remote from the power source, do not trip because the fault keeps high currents from that portion of the line. The difference in the condition of the various fault indicators allows maintenance personnel to locate the fault between the tripped and reset indicators.

OBJECTS AND SUMMARY OF THE INVENTION

It is an object of the invention to provide an improved and simplified fault indicator.

According to an aspect of the invention a fault indicator includes sensing means having an inductive sensor for location in the magnetic field surrounding a conductor, electronic means responsive to the sensing means for assuming a first state in response to the sensing means sensing a trip condition and for remaining in the first state until set to a second state, signaling means coupled to the electronic means for generating a signal only in response to the electronic means being in the first state, and timing means responsive to the electronic means assuming the first state for setting the electronic means to the second state after a predetermined period.

According to another feature of the invention, the inductive sensor includes a winding having an axis for mounting transverse to the conductor.

According to another feature of the invention, the electronic means includes an inrush restraining circuit.

These and other features of the invention are pointed out in the claims. Other objects and advantages of the invention will become evident from the following detailed description when read in light of the accompanying drawings.

DESCRIPTION OF PREFERRED EMBODIMENTS

Figure 1:
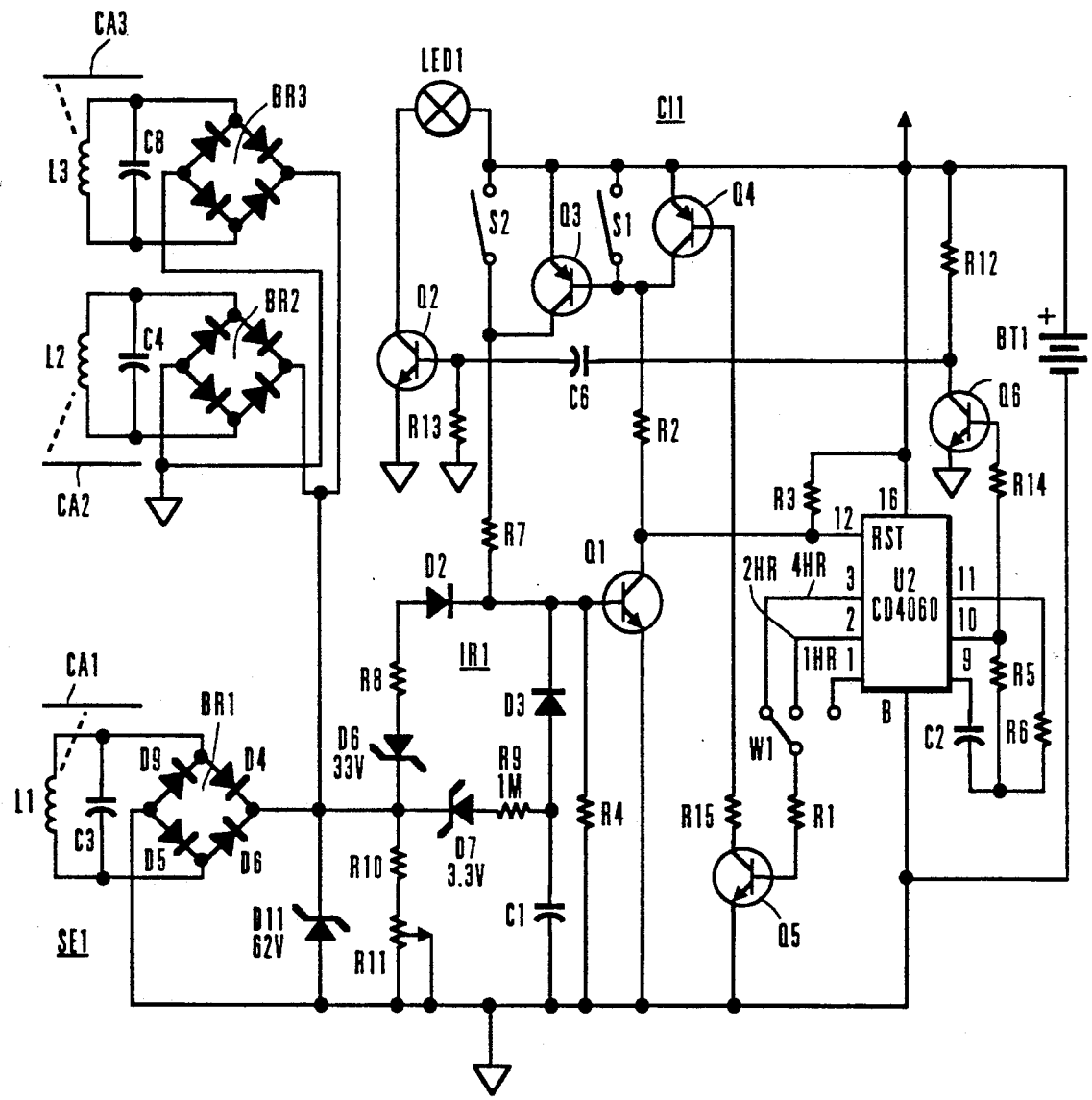
FIG. 1 is a schematic diagram of a fault indicator embodying features of the invention.
Figure 2:
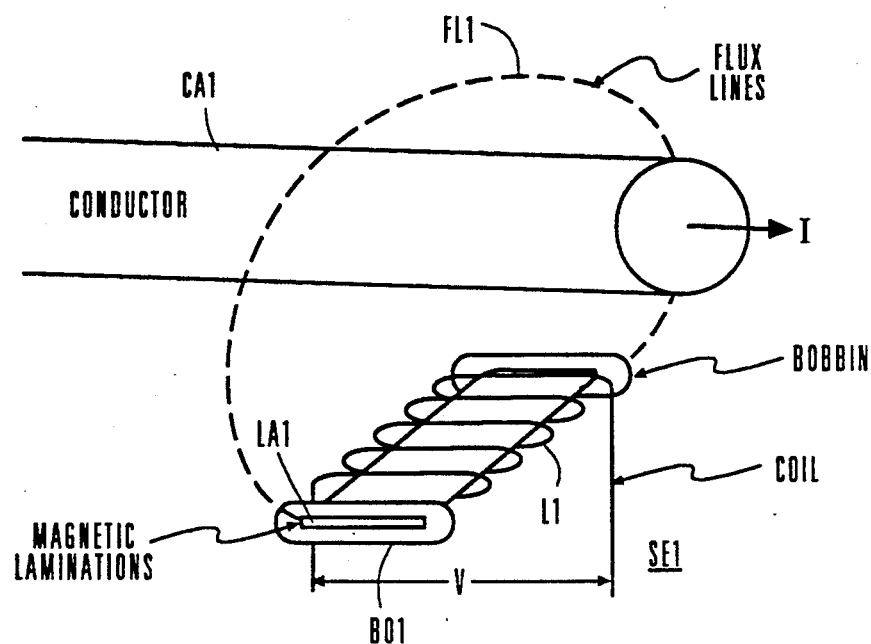
FIG. 2 is a perspective view of a portion of the fault indicator of FIG. 1.
Figure 3:
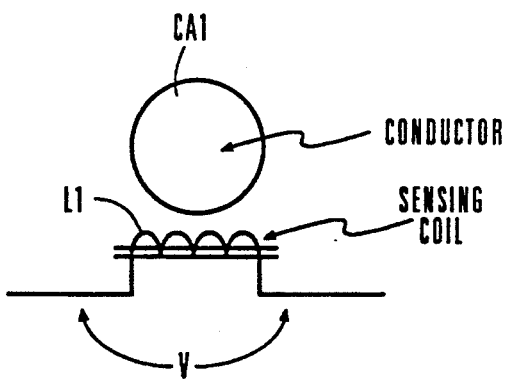
FIG. 3 is an end view of the portion of the fault indicator in FIG. 2.

In FIG. 1, a sensor coil L1 senses current in a power cable or conductor CA1. As shown in FIGS. 2 and 3 the sensor coil L1 forms part of a sensor SE1 and includes multiple turns of wire W1 surrounding a bobbin BO1. The sensor coil L1 is mounted on the cable CA1 to extend perpendicular to the cable. Magnetic laminations LA1 filling the center of the bobbin BO1 increase the magnetic flux lines FL1 passing through the bobbin, and hence increase the sensitivity of the sensor SE1. The flux lines FL1 encircling the cable CA1 respond to the current in the cable and induce a voltage V in the sensor coil L1 proportional to the current in the cable.

In FIG. 1, a capacitor C3 forms a tuning circuit with the inductive component of the sensor SE1 and further improves the sensitivity of the sensor. Moreover, tuning the sensor SE1 with the capacitor C3 minimizes the effect of the phase difference between the power cable (CA1) current and the terminal voltage V of the sensor. A bridge BR1 composed of four diodes D4, D5, D8, and D9 fullwave rectifies the voltage across the coil L1, and produces voltage across loading resistors R10 and R11 proportional to the current in the power cable CA1. A Zener diode D11 limits the voltage to a value of less that 62 volts.

Diodes D2, D3, D6, D7, resistors R8, R9, and a capacitor C1 form a time-overcurrent inrush restraint circuit IR1. The latter prevents temporary inrush currents that arise when power is turned on or restarted from initiating a trip signal. Specifically, the branch composed of the Zener diode D7, the resistor R9, the diode D3 and the capacitor C1 passes an on potential across a base resistor R4 only if the current in the cable CA1 induces a voltage sufficient to overcome the 3.3 volt Zener diode D7 for a time determined by voltage and the time constant of resistor R9 and capacitor C1. If the voltage across resistors R10 and R11 is high enough to overcome the 33 volt Zener diode D6, it will turn on transistor Q1 without delay.

A fault causes overcurrents which are high enough and long enough to bias the transistor Q1 on. Inrush currents generally are not sufficiently high or are too short lasting to turn on transistor Q1.

When the voltage across the resistor R4 is high enough to turn on transistor Q1 its collector goes low and initiates a trip operation. A regenerative feedback transistor Q3 connected to a collector resistor R2 keeps the transistor Q1 on through a collector resistor R7. This maintains the collector of transistor Q1 low until reset.

The low collector of transistor Q1 pulls down the RST pin of a timer IC (integrated circuit) U2 and starts an oscillator in the timer IC U2. A capacitor C2 and resistors R5 and R6 set the timing frequency of the oscillator. The latter produces a rectangular waveform which provides timing clocks to 13 internal stages of cascaded flip-flops.

The oscillator drives a transistor Q6, having a collector resistor R12, through a resistor R14. This turns an LED (light emitting diode) driver transistor Q2 on and off. The duration of the drive pulses to transistor Q2 is a function of a coupling capacitor C6 and a base biasing capacitor R13. An LED LED1 then blinks in response to the oscillator. The pulse widths that produce the blinking are minimized to reduce the power drain on a battery BT1 which energizes the entire system.

The blinking continues until the oscillator output ripples through the internal flip flops of the IC U2 to produce a high at the IC's terminal 1, 2, or 3 selected by the switch W1. A resistor R1 then turns on a transistor Q5 which turns on a transistor Q4 through a resistor R15. The latter turns off the feedback transistor Q3 which then turns off the transistor Q1 through the resistor R7. This places a high on the terminal 12 of the IC U2 and turns off the oscillator. As a result, transistors Q6 and Q2 turn off and transistor Q2 stops pulsing the LED LED1. The latter now turns off. The IC U2 also turns off the transistors Q5 and Q4. The circuit is thus in a "sleep" state.

In the "sleep" state the drain on the battery BT1 is negligible. The circuit can be manually reset by activating a reed switch S1. A reed switch S2 furnishes a manual trip test to verify the operation of the circuit.

Addition of sensor coils L2 and L3 with respective tuning capacitors C4 and C8, and bridges BR2 and BR3 forms a three phase fault indicator. The sensor coils L2 and L3 sense the currents in cables CA2 and CA3 which form a three phase system with the cable CA1.

Figure 4:
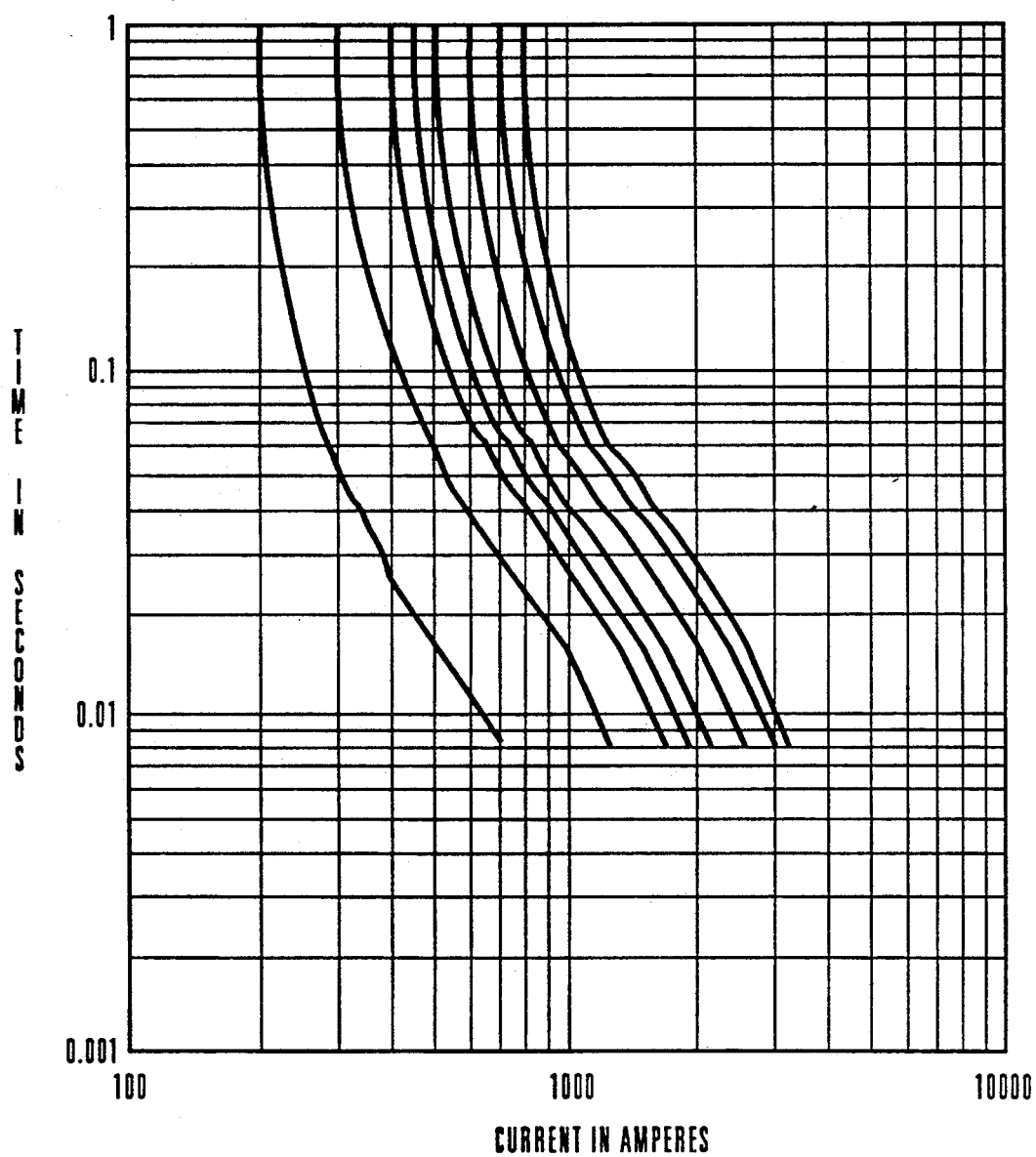
FIG. 4 is a graph illustrating the inrush restraining operation of a fault indicator embodying features of the invention.

FIG. 4 illustrates a family time-current curves. The inrush restraint circuit IR1 imposes one of these curves on the circuit in FIG. 1. The selection of the curve used is based upon a desired trip rating and depends upon the values of the resistors R10 and R11. The resistor R9 and the capacitor C1 shape the curve and the resistors R10 and R11 shift the curve to one of the positions shown in FIG. 4. The resistor R11 is variable to compensate for normal variations in the mechanical and electrical construction of the equipment. The time and current combination must be to the right of the selected curve to initiate a trip in the circuit of FIG. 1. The inrush restraint circuit IR1 causes the trip circuit to distinguish between inrush currents having insufficient time-current combinations and actual faults.

Figure 5:
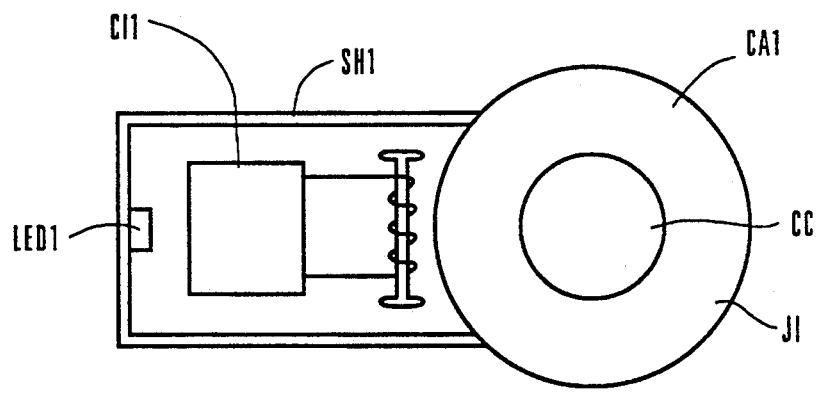
FIG. 5 is a view showing the fault indicator of FIG. 1 mounted on a cable.

FIG. 5 illustrates the circuit CI1 of FIG. 1, without the sensors L2 and L3 and without the members BR2, BR3, C4, and C8, mounted on the cable CA1. Here, a shell SH1 mounts the sensor SE1 with its bobbin BO1 and coil CO1 transverse to the direction of the cable CA1. The LED LED1 is here shown as being outside the circuit CI1. As illustrated in FIG. 5 the cable CA1 includes a center conductor CC and a jacketing insulator JI. However the term cable may be used in the sense of "conductor" alone. In FIGS. 2 and 3, the cable CA1 appears in the form of an un-insulated conductor.

The invention may be used without the coils L2 and L3, the tuning capacitors C4 and C8, and the bridges BR2 and BR3 on the cable of a single phase line or on one cable of a three phase line. On the other hand the bridges BR2 and BR3 may be connected as shown. In the latter case, wires connect the bridges BR2 and BR3 to the bridge BR1 in the circuit CI1 of the shell SH1.

In operation, normal current flows in the cables CA1, CA2, and CA3 do not induce sufficient voltage across the resistors R10 and R11 to turn on transistor Q1. Hence, the transistors Q3, Q4, Q5, Q6, and Q2, and IC U2 remain off. This holds off LED LED1. An inrush current upon ignition of power is too low and short to turn on transistor Q1 through the inrush restraint circuit IR1. A fault current produces a voltage high enough and long enough to turn on transistor Q1. This turns on transistor Q3 which latches transistor Q1 on. It also starts the oscillator in IC U2 which turns both transistors Q2 and Q6 on and off repeatedly. This causes the LED LED1 to blink. The blinking continues until the timer in IC U2 turns on transistors Q5 and Q4. The latter turns off transistor Q3 and hence transistor Q1. This then turns off IC U2 which stops pulsing of the transistors Q6 and Q2 and the blinking of LED LED1. It also turns off transistors Q4 and Q5. The circuit remains in this sleep state until the next fault.

A switch W1 selects the time, 1 hour, 2 hours, or 4 hours, during which the timer operates. Thus, when the timer operates, the LED LED1 continues blinking for the time selected by the switch W1. The circuit may be manually reset by actuating the reed switch S1 to stop the blinking. The switch S1 turns off the transistor Q3 which unlatches transistor Q1 and turns off the IC U2 and the transistors Q6, Q2, Q4, and Q5. The reed switch S2, when actuated, turns on the transistor Q1 to furnish a manual trip signal that tests the trip operation.

While embodiments of the invention have been described in detail, it will be evident to those skilled in the art that the invention may be embodied otherwise without departing from its spirit and scope.

What is claimed is:

1. A power-line faulted circuit indicator, comprising:
sensing means for location in a magnetic field surrounding a conductor carrying current to a load for sensing a trip condition in the conductor;
electronic means responsive to said sensing means for assuming a first state in response to said sensing means sensing a trip condition representing excessive current flow and for remaining in the first state until set to a second state representing less than excessive current flow;
signaling means coupled to said electronic means for generating a signal only in response to said electronic means being in the first state;
timing means responsive to said electronic means assuming the first state for setting said electronic means to the second state after a predetermined period;
manual means for setting said electronic means to the second state before the predetermined period has expired so that said sensing means can resume sensing for a trip condition in the conductor;
said sensing means including an inductive sensor for coupling to the conductor.

2. A fault detector as in claim 1, wherein said inductive sensor includes a coil having an axis for mounting transverse to the conductor.

3. A fault indicator as in claim 1, wherein said electronic means includes an inrush restraint circuit.

4. An indicator as in claim 1, wherein
said sensing means includes a plurality of inductive sensors each for coupling to one of a plurality of conductors carrying current to a load;
each of said sensors is connected to said electronic means.

5. An indicator as in claim 2, wherein said inductive sensor is a substantially air core sensor having a coil extending along an axis substantially only transverse to the conductor.

6. A power system, comprising:
a conductor for carrying current to a load;
sensing means located in a magnetic field surrounding the conductor for sensing a trip condition in said conductor;
electronic means responsive to said sensing means for assuming a first state in response to said sensing means sensing a trip condition representing excessive current flow and for remaining in the first state until set to a second state representing less than the excessive current flow;

signaling means coupled to said electronic means for generating a signal only in response to said electronic means being in the first state;

timing means responsive to said electronic means assuming the first state for setting said electronic means to the second state after a predetermined period;

manual means for setting said electronic means to the second state before the predetermined period has expired so that said sensing means can resume sensing a trip condition in said conductor;

said sensing means including an inductive sensor for coupling to the conductor.

7. A power system, comprising:

a plurality of conductors each for carrying current to a load;

a plurality of sensing means each for a location in the magnetic field surrounding one of the conductors;

electronic means responsive to each of said sensing means for assuming a first state in response to one of said sensing means sensing a trip condition representing excessive current flow in one of said conductors and for remaining in the first state until set to a second state representing less than excessive current flow;

signaling means coupled to said electronic means for generating a signal only in response to said electronic means being in the first state;

timing means responsive to said electronic means assuming the first state for setting said electronic means to the second state after a predetermined period;

manual means for setting said electronic means to the second state before the predetermined period has expired so that said sensing means can each resume sensing a trip condition in said conductors;

each of said sensing means including an inductive sensor for coupling to one of said conductors.

* * * * *